(12) United States Patent
Guzzon et al.

(10) Patent No.: US 11,070,296 B1
(45) Date of Patent: Jul. 20, 2021

(54) OPTICAL RECEIVER WITH AN OPTICALLY COMPENSATED AMPLIFIER CONTROL LOOP

(71) Applicant: Juniper Networks, Inc., Sunnyvale, CA (US)

(72) Inventors: Robert S. Guzzon, Santa Barbara, CA (US); John Garcia, Santa Barbara, CA (US); Theodore J. Schmidt, Lucas, TX (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 16/887,312

(22) Filed: May 29, 2020

(51) Int. Cl.
*H04B 10/69* (2013.01)

(52) U.S. Cl.
CPC ....... *H04B 10/6931* (2013.01); *H04B 10/691* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,909,536 | B1* | 6/2005 | Walker | H04B 10/67 359/337 |
| 9,647,753 | B1* | 5/2017 | Kurisu | H04B 10/07957 |
| 2004/0062557 | A1* | 4/2004 | Takashima | H04B 10/674 398/209 |
| 2013/0322876 | A1* | 12/2013 | Gehrke | H04B 10/0799 398/38 |
| 2015/0016828 | A1* | 1/2015 | Swoboda | H04B 10/6931 398/202 |
| 2016/0268981 | A1* | 9/2016 | Jiang | H03F 3/087 |
| 2017/0131142 | A1* | 5/2017 | Luk | G01J 1/4228 |

OTHER PUBLICATIONS

"European Application Serial No. 20182957.9, Extended European Search Report dated Dec. 1, 2020", 15 pgs.

* cited by examiner

*Primary Examiner* — Omar S Ismail
(74) *Attorney, Agent, or Firm* — Schwegman Lundberg & Woessner, P.A.

(57) ABSTRACT

An optical receiver can implement a transimpedance amplifier (TIA) to process received light using a closed loop optical pre-amplification. The optical receiver can use an average input value of the TIA to control an semiconductor optical amplifier (SOA) or pre-amplification as received average signal varies. The optical receiver can include a gain controller for the TIA that can measure the TIA swing to adjust the gain of the SOA to pre-amplify received light in a closed loop control configuration.

20 Claims, 9 Drawing Sheets

OPTICAL RECEIVER WITH AN OPTICALLY COMPENSATED AMPLIFIER CONTROL LOOP

TECHNICAL FIELD

The present disclosure generally relates to signal amplification and more particularly to amplifying signals using optical and electrical amplifiers.

BACKGROUND

An optical receiver can receive light from transmitters over an optical network. The received light may exhibit different optical losses for different reasons including different transmission powers (e.g., from different transmitters), different path losses, and other reasons. A received optical signal can be input into an amplifier circuit to change the characteristics of the signal. However, there is a practical tradeoff between operating range of various amplifier types and noise considerations. It is currently difficult to implement a good amplifier (e.g., a transimpedance amplifier) design that exhibits both low noise and linear performance.

BRIEF DESCRIPTION OF THE DRAWINGS

The following description includes discussion of figures having illustrations given by way of example of implementations of embodiments of the disclosure. The drawings should be understood by way of example, and not by way of limitation. As used herein, references to one or more "embodiments" are to be understood as describing a particular feature, structure, or characteristic included in at least one implementation of the inventive subject matter. Thus, phrases such as "in one embodiment" or "in an alternate embodiment" appearing herein describe various embodiments and implementations of the inventive subject matter, and do not necessarily all refer to the same embodiment. However, they are also not necessarily mutually exclusive. To easily identify the discussion of any particular element or act, the most significant digit or digits in a reference number refer to the figure ("FIG.") number in which that element or act is first introduced.

Figure 1:
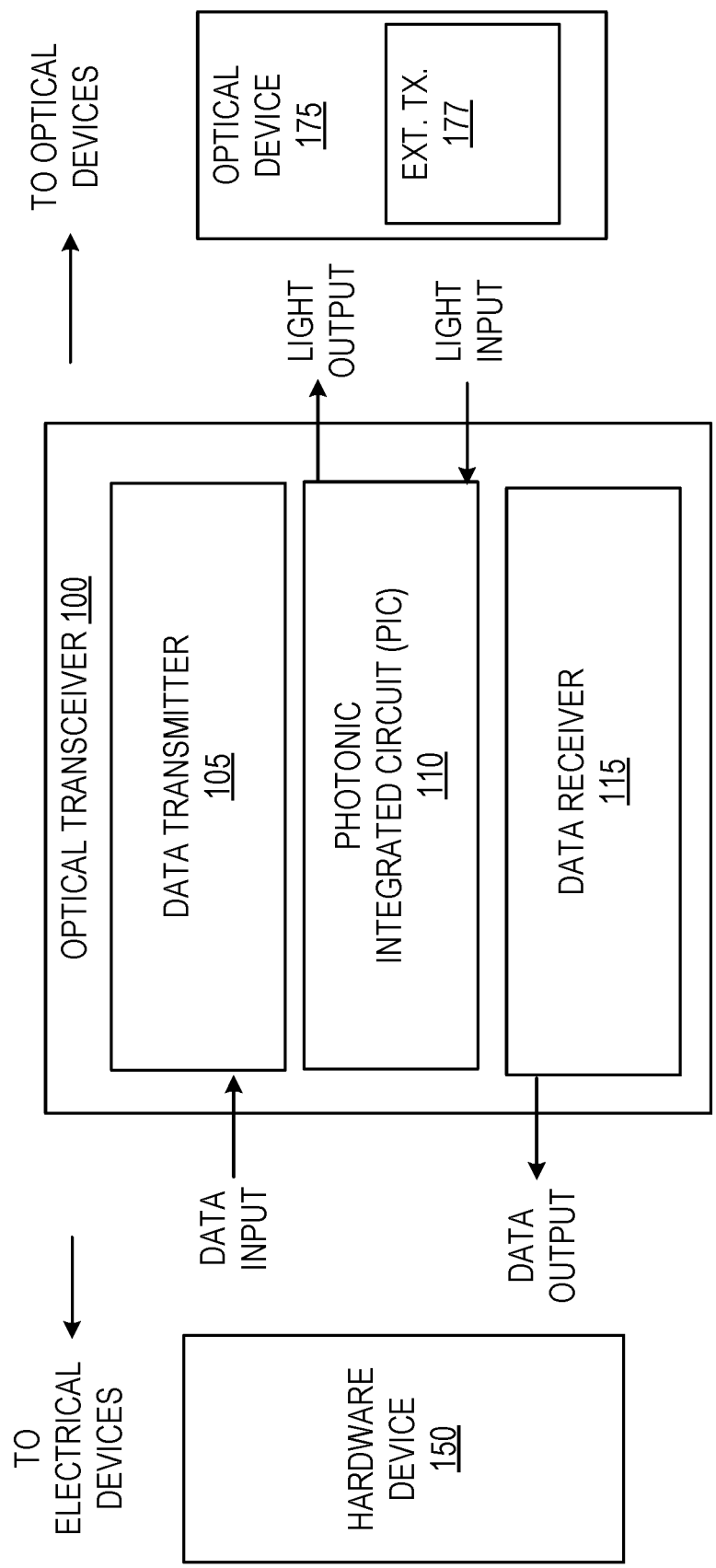
FIG. 1 is a block diagram illustrating an optical transceiver for transmitting and receiving optical signal, according to some example embodiments.

Descriptions of certain details and implementations follow, including a description of the figures, which may depict some or all of the embodiments described below, as well as discussing other potential embodiments or implementations of the inventive concepts presented herein. An overview of embodiments of the disclosure is provided below, followed by a more detailed description with reference to the drawings.

DETAILED DESCRIPTION

In the following description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, structures, and techniques are not necessarily shown in detail.

As discussed, it can be difficult to design an amplifier system for an optical receiver that exhibits both low noise and good linear performance, especially in high order modulation formats, such as four-level pulse amplitude modulation (PAM4). One type of optical receiver includes a TIA that receives a small input current and then amplifies and converts the current to an output signal voltage. For example, an optical signal can be received via an input fiber (e.g., signal from an optical network), and a photodetector can convert the optical signal into a corresponding electrical current signal. The electrical current signal can then be input into a transimpedance amplifier to convert the current signal into a corresponding voltage signal output, which can then be processed by other circuits or modules of the receiver system. The dynamic range of the TIA is characterized by the input swing voltage for which the TIA can still deliver a desired target output swing, where the term swing denotes the peak to peak distance from the ones and zeroes of the electrical data. Generally, the OMA of an optical signal in a transmission system can be characterized by its peak to peak power: OMA=P1−P0, where P1 is the power of the light source while active (e.g., the 1s in binary optical signal) minus P0, which is the power of the light source when inactive (e.g., the 0s in binary signal). The peak to peak power can be averaged to yield the average power of the signal, e.g., Average=OMA/(P1−P0). The extinction ratio is a decibel ration of the receiver power over the lower power. At low frequencies, the transimpedance, Z_T, is the change in output voltage per the change in input current: Z_T= (Δv_output)/(Δi_input). To perform consistently, the transimpedance should be linear, thereby allowing a predicable output voltage signal for a given input signal. However, if the input signal characteristics vary (e.g., due to different transmitter characteristics, different path losses, different high or low frequencies), then a non-linear response is exhibited by a given TIA. Accordingly, as the received signal varies, it can be difficult to implement a TIA that addresses a wide dynamic range of the input signals while consistently generating output signal that exhibits good linear voltage with low noise, especially in modulation formats in which linearity has a significant effect on signal quality.

Generally, in PAM4, TIA linearity and noise are especially significant because there are four signals being processed and each must be processed and separated. PAM4 extends the on/off concept (high/low, one or zero) and controls the brightness of the light source in four discrete steps: off, one-third on, two-thirds on, and fully on. By using a four-level signal, two bits can be transmitted in every signaling period. For example, in one format of PAM4 (e.g., "gray-coded" PAM4), the bit pair "00" selects the first (lowest) level, "01" selects the second level, "11" selects the third level, and "10" selects the fourth (highest) level, and other formats can likewise be encoded (e.g., "binary coded" PAM4 in which the "10" selects the third level and the "11" selects the fourth level). Due to its capability to encode more than one bit per symbol, 4-PAM (also known as PAM4) is known as a higher-order modulation format. In particular, for example, compared with the non-return to zero (NRZ) signal, the 4-PAM signal occupies only half the bandwidth for a given bit rate, making it a more bandwidth-efficient format. However, the 4-PAM format requires a higher signal-to-noise ratio than other modulation formats; because the 4-PAM receiver has to discriminate between four levels, it is more affected by noise, which leads to a substantially lower sensitivity.

To this end, a TIA compensating optical receiver can be implemented that uses a semiconductor amplifier (SOA) to pre-amplify the received optical signal before the optical signal is detected by the photodetector (e.g., a fast photodiode) such that the TIA receives a consistent input that is dynamically maintained in a closed-loop (feedback) driven loop. In this way, the constraints placed upon the TIA are relaxed as the optical signal is first pre-optically strengthened using the SOA before being electrically amplified by TIA, thereby enabling the TIA to output a consistent linear response with low noise as the TIA operates over a more practical range that is available in off the shelf TIA chips and circuit designs.

TIA Average Direct Current (DC) based Control Loop: In some example embodiments, the optical receiver includes a photocomic integrated circuit that receives the light and converts it into a small current using a photodetector. The small current of the photodetector can then be input into a receiver subassembly ASIC (e.g., a ROSA) that manages processing the received current by filtering and demodulating it into data for further processing. In some example embodiments, the receiver subassembly includes a TIA at or near the input port to convert the small current from the photodiode to the larger voltage signal for processing. In some example embodiments, the receiver subassembly includes a received signal strength indicator (RSSI) circuit that is connected to the input port of the TIA to detect the strength of the received signal (e.g., detect the DC current, or average strength of the received input signal).

In some example embodiments, to relax design constraints of the TIA in the receiver subassembly ASIC, the optical receiver uses the RSSI value generated to optically pre-amplify the received light in an optical amplification closed control loop that can rapidly stabilize the input current seen by the TIA before such changes cause performance issues for the TIA. For example, if the average photocurrent decreases (e.g. due to loss, transmitter issues), then the RSSI circuit will generate a signal or data that is stored and accessed by a controller circuit (e.g., ASIC memory on the receiver subassembly, or memory of central processing unit (CPU) of the optical receiver). The controller circuit then accesses the RSSI output to generate an instruction to create the optical gain of a SOA placed before the photodetector. In this way, by the controller continuously updating the SOA optical gain according to the RSSI values, closed loop control of the SOA is achieved and the TIA can perform within a narrower, less noisy, and more linear operating range.

TIA Alternating Gain Control Loop: In some example embodiments, the closed loop SOA compensation for the TIA in the optical receiver is implemented using OMA based control (e.g., alternating current (AC) or peak signal based control). Generally, the OMA of optical signal in a transmission system can be characterized by its peak to peak power: OMA=P1−P0, where P1 is the power of the light source while active (e.g. the 1s in binary optical signal) minus P0, which is the light source in an inactive or "low" state (e.g., the 0s in binary signal). The peak to peak power can be averaged to yield the average power of the signal, e.g., Average=OMA/(P1−P0). The extinction ratio is a decibel ratio of the receiver power over the lower power.

In some example embodiments, the TIA in the receiver subassembly outputs to a peak detector circuit, which receives the signal and detects the highest (top peak) or lowest (bottom peak), or highest to lowest (top peak to lowest peak) value, which is then used to control an automatic gain control (AGC) circuit that continually adjusts the electrical gain of the TIA to maintain a constant output swing. While the AGC can adjust the gain of the TIA, the AGC can only vary so much and cannot correct for large variances in optical loss in the optical signal received by the photonic integrated circuit (PIC) of the receiver.

In some example embodiments, the optical receiver stabilizes the current being input into the TIA by repurposing the AGC gain value (that is being used to adjust gain of the TIA in the receiver subassembly) as an indicator of the TIA input signal power dropping, which is used to increase gain of the SOA in the PIC of the optical receiver. For example, upon the TIA output voltage changing, the peak detector detects the change and stores it as a new peak value, which the AGC uses to adjust gain of the TIA. In some example embodiments, the AGC adjustment values are stored in memory of the receiver subassembly (e.g., registers), which are then accessed by a controller (e.g., optical receiver microcontroller) using a data interface to receive the AGC values. Upon accessing the AGC values, the microcontroller then generates a control current to continually adjust the gain to increase or decrease the SOA gain such that the SOA gain acts as an automatic closed feedback pre-amplification loop that stabilizes the TIA input current and further relaxes the operating range of a given TIA.

In this way, the AGC functions as an indicator of the current being input into the TIA. For example, if the input current falls, the swing may vary, which causes the AGC value to increase to compensate for the decreased input current. In some example embodiments, the AGC value is stored in memory accessible or otherwise managed by a microcontroller in the optical receiver. In some example embodiments, the microcontroller can read the AGC value and use the AGC value to pre-amplify the signal using the SOA to further compensate for the TIA. In this way, the implicit peak to peak value, as measured by the peak detector and reflected in the AGC gain, is an optical control loop for the gain of the SOA. This approach can be advantageous over RSSI average values in some optical-electrical device designs because signals of different swings may have the same average current value as detected by the RSSI. That is, for example, a low extinction ratio signal may have a small peak to peak current value and a high extinction ratio signal may have a larger peak to peak current value. However, the strong and weak signals may have the same RSSI value as detected by the RSSI module, which is detecting an average value, and there is no indication what the actual amplitude of each signal is. In contrast, when using a peak to peak module to monitor, the output of the TIA can detect the actual swing of the signals, and if the swing at the output of the TIA varies, it is used as an implicit indication that the Ipp input of the TIA is varying, which can then be used to more accurately to pre-amplify the incoming data using a SOA-based control loop, as discussed in further detail below. One additional advantage of an OMA compensating receiver is that the SOA can be more accurately calibrated to optimize the signal being input into the TIA. Conventionally, optically pre-amplified receivers assume a minimum extinction ratio (ER) level for any received data, and set a SOA to be biased to compensate for the minimum assumed ER (ERmin). However, and in accordance with some example embodiments, with the optical receivers OMA sensing capability (through the AGC gain reading), the optical receiver "knows" the actual OMA/ER, and so for cases where ER>ERmin, the SOA gain can be reduced to something lower than X (a standard fixed bias value), thereby saving on power consumption.

FIG. 1 is a block diagram illustrating an optical transceiver 100 for transmitting and receiving optical signal, according to some example embodiments. The optical transceiver is an example system in which a compensating receiver can be integrated. As illustrated, the optical transceiver 100 can be implemented to interface electrical data from electrical devices, such as electrical hardware device 150, convert the electrical data into optical data, and send and receive the optical data with one or more optical devices, such as optical device 175 (e.g., an external transmitter 177 of a remote optical device, switch, server, etc.). For explanatory purposes, in the following description, the electrical hardware device 150 is a host board that "hosts" the optical transceiver 100, as a pluggable device that sends and receives data to an optical switch network, where, for example, optical device 175 can be other components of an optical switch network. However, it is appreciated that system 100 can be implemented to interface other types of electrical devices and optical devices. For instance, optical transceiver 100 can be implemented as a single chip on a hybrid "motherboard" that uses an optical network (e.g., waveguides, fibers) as an optical bus to interconnect onboard electrical chips that process the data after it is converted from light into binary electrical data, according to some example embodiments.

In some example embodiments, the hardware device 150 includes an electrical interface for receiving and mating with an electrical interface of the optical transceiver 100. The optical transceiver 100 may be a removable front end module that may be physically received by and removed from hardware device 150 operating as a back end module within a communication system or device. The optical transceiver 100 and the hardware device 150, for example, can be components of an optical communication device or system (e.g., a network device) such as a wavelength-division multiplexing (WDM) system or PAM4 system. For instance, a PAM4 system may include a plurality of slots reserved for a plurality of hardware device host boards.

The data transmitter 105 of the optical transceiver 100 can receive the electrical signals, which are then converted into optical signals via PIC 110. The PIC 110 can then output the optical signals via optical links, such as fiber or waveguides that interface with the PIC 110. The output light data can then be processed by other components (e.g., switches, endpoint servers, other embedded chips of on a single embedded system), via a network such as a wide area network (WAN), optical switch network, optical waveguide network in an embedded system, and others.

In receiver mode, the optical transceiver 100 can receive high data rate optical signals via one or more optical links to optical device 175. The optical signals are converted by the PIC 110 from light into electrical signals for further processing by data receiver 115, such as demodulating the data into a lower data rate for output to other devices, such as the electrical hardware device 150. The modulation used by the optical transceiver 100 can quadrature phase-shift keying (QPSK), binary phase-shift keying (BPSK), polarization-multiplexed BPSK, M-ary quadrature amplitude modulation (M-QAM), and others.

Figure 2:
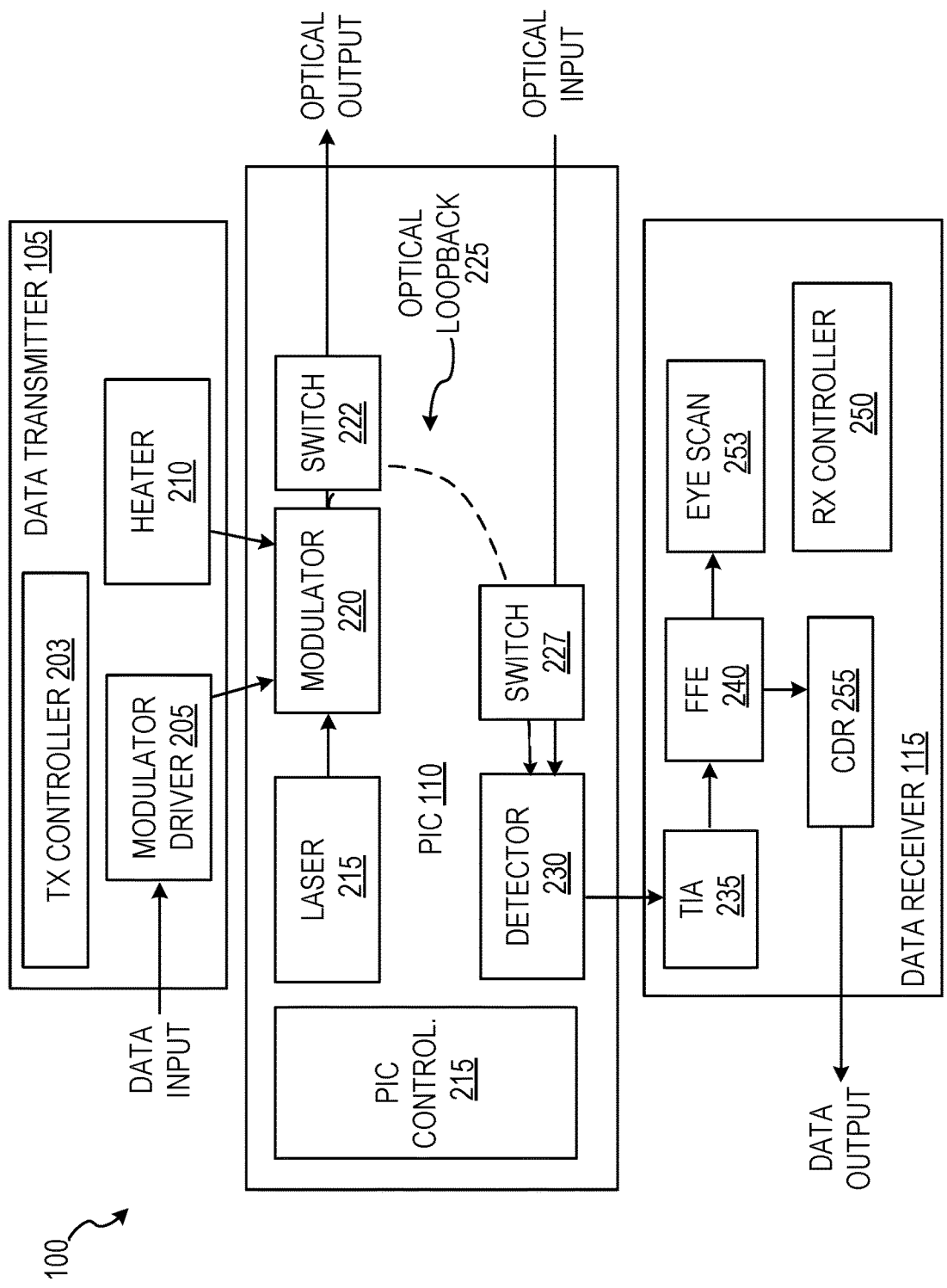
FIG. 2 shows example functional components of the optical transceiver, according to some example embodiments.

FIG. 2 shows example functional components of the optical transceiver 100, according to some example embodiments. The data transmitter 105 manages receiving electrical data and controlling components of the PIC 110 using instructions stored in the transmitter (TX) controller 203. Examples of TX controller 203 include, but are not limited to, a digital signal processing (DSP) unit, a general purpose microprocessor, an ASIC, a field programmable gate array (FPGA), a combination thereof, or other equivalent integrated or discrete logic circuitry with accompanying memory to store control instructions for execution.

In some example embodiments, the data transmitter 105 receives electrical data input from an external device, such as an external host device or host board. The transmitter controller 203 can then execute instructions that convert the electrical data into optical modulation data that the modulator driver 205 uses to control an optical modulator 220 (e.g., phase shifter, electro-absorption modulator (EAM), Mach-Zehnder Interferometer (MZI) modulator) in the PIC 110. The modulator 220 receives light from a light source such as laser 215, which then modulates the received light according to the modulation instructions (e.g., converting binary electrical data to PAM4 modulation or QPSK modulation symbol data), which is then output from the PIC 110 as output light (e.g., output light that is transmitted over an optical switch network). In some example embodiments, to compensate for environmental or device temperatures, which may affect the modulation characteristics of the optical modulator 220, the transmitter controller 203 controls a heater 210 to dynamically keep the modulator at a desired operating range. Although the example of FIG. 2 illustrates a simplified version of transmitter 105 with various components not included for brevity, it is appreciated that the transmitter 105 can include additional various components, further discussed below, and in accordance with some example embodiments.

The PIC 110 can receive optical input light (e.g., from a single mode fiber) that is detected by optical detector 230, which can use an optical element, such as a photodiode and/or other elements, to detect the photons in the received light and convert the light into electricity for demodulation processing by the data receiver 115, as discussed in further detail below.

In some example embodiments, the PIC 110 includes an optical loopback path 225 (e.g., integrated waveguide) that directs the output light immediately from the transmitting components (e.g., transmitter optical subassembly (TOSA) comprising modulator 220 and data transmitter 105) to the receiving components (e.g., a ROSA comprising detector 230, data receiver 115) to analyze and calibrate the transceiver 100 during design, testing, and manufacturing stages, as well as in the field (e.g., after integration into an end product).

The loopback path 225 allows for on-chip or intra module characterization of transceiver 100, including, but not limited to, tests such as bit error rate (BER) characterization, received power characterization, and calibration of filters (e.g., multiplexer, de-multiplexer, etc.) present in the transceiver.

In some example embodiments, the PIC 110 includes an optical switch 222 that can receive a control signal to direct the output of transmitting component (e.g., modulator 220) towards the receiving components (e.g., detector 230). In some example embodiments, the loopback path 225 switching elements may be comprised of (but not limited to) all or a subset of the following optical components: a SOA, a thermo-optic switch, a p-i-n diode switch, or a switch network composed of one or more multimode interference (MMI) couplers and Mach Zehnder interferometers (MZIs). The addition of the switching element allows for the imposition of an electrical control signal to determine the routing of the optical signal from the transmitter. For a particular control condition, the switch could enable within PIC (or module) routing of the optical signal from the transmitter to the receiver.

For a different control condition, the same switching element could ensure that the optical signal is routed from the transmitter to the external optical link. In some example embodiments, the PIC includes a further optical switch 227 that receives a control signal to receive light on the loopback path 225 from the receiving components (e.g., modulator 220, switch 222). In this way, the optical transceiver 100 eliminates the need for an external optical link to the module to form an optical link between the transmit and receive paths of a transceiver, thereby eliminating external coupling calibration operations, coupling loss, external fiber-to-switch connections, and so forth. Furthermore, calibration and functional verification of the individual transmit and receive sections of a transceiver is not limited to solutions that require a physical optical connection to be made external to the unit. Moreover, when the transceiver needs to be set to "normal" operation mode, no external connection between the transmitter and receiver need be disconnected because the integrated loopback path may simply be disabled.

Although the example of FIG. 2 illustrates a simplified version of PIC 110 with various components not included for brevity, it is appreciated that the PIC 110 can include additional various components for sending and receiving light (e.g., MZIs, electro-absorption modulation (EAMs), multiplexers, demultiplexers, filters).

The data receiver 115 manages receiving electrical data from the PIC 110 and processing the electrical data (e.g., amplifying filtering, demodulating) by controlling components of the receiver 115 using instructions executed and/or stored in the receiver (RX) controller 250. Examples of RX controller 250 include, but are not limited to, a DSP unit, a general purpose microprocessor, an ASIC, an FPGA, a combination thereof, or other equivalent integrated or discrete logic circuitry with accompanying memory to store control instructions for execution.

The electricity (e.g., electrical signal, electrical current) generated by the detector 230 can be converted into an amplified electrical voltage by the TIA 235, which is then processed by a feed forward equalizer (FFE) 240. The FFE implements one or more delays to create and combine a delayed version of the signals to filter and enhance the signal. In some example embodiments, the FFE 240 inputs the filtered electrical signal into a receiver eye scan analyzer 253 that can be implemented by the RX controller 250 to analyze the received signal (e.g., by generating one or more eye diagrams).

Further, and in accordance with some example embodiments, the filtered signal is then processed by a clock and data recovery (CDR) module 255 to process and recover timing/clock characteristics of the data (e.g., extract the clock signal and retime the data signal), which is then further processed or is output as data (e.g., for further processing by an external device, such as hardware device 150).

Figure 3A:
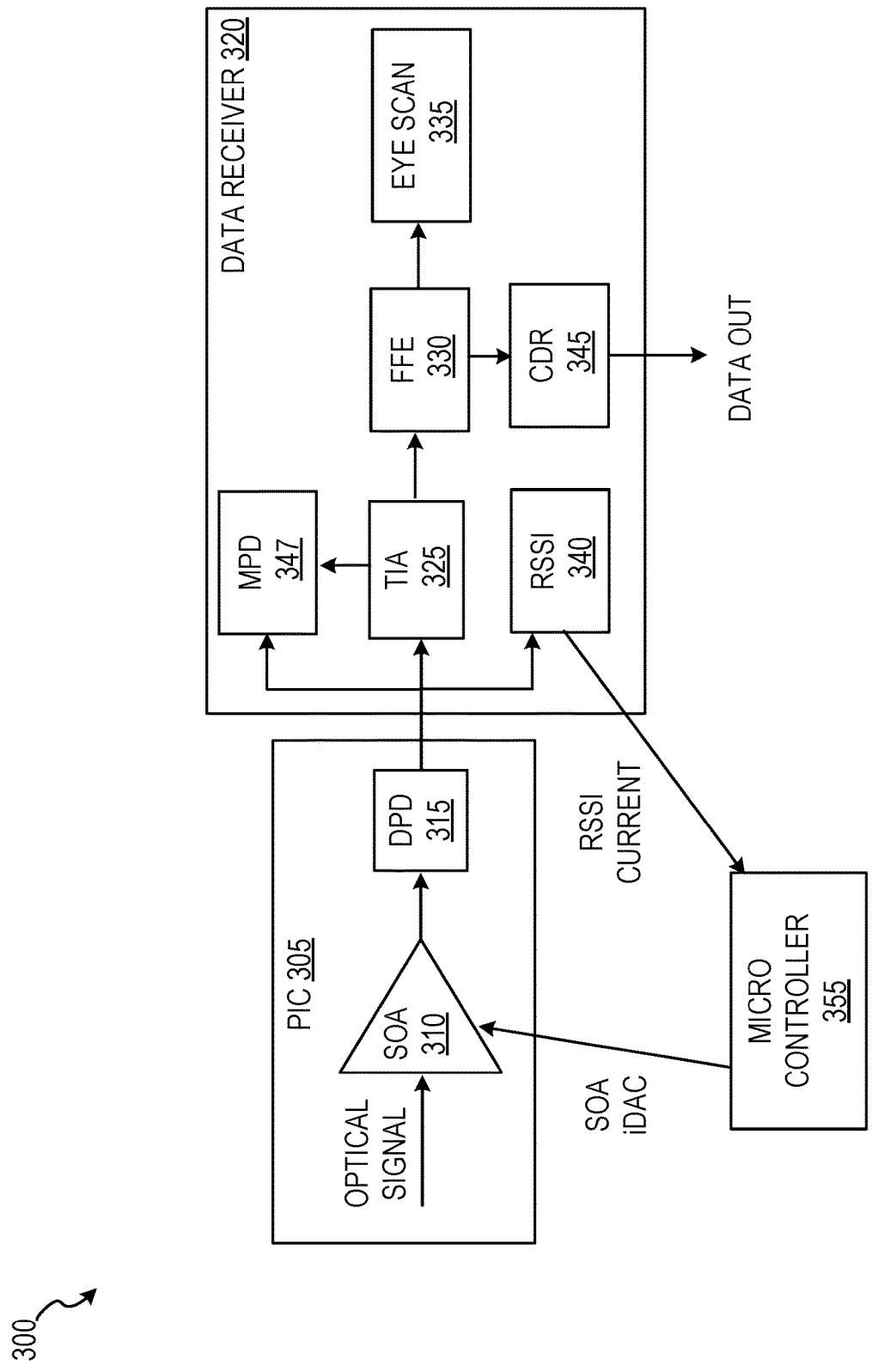
FIG. 3A shows an example compensating optical receiver structure using average current for closed loop control of a transimpedance amplifier (TIA), according to some example embodiments.

FIG. 3A shows an example compensating optical receiver structure 300 using average current for closed loop control of a TIA, according to some example embodiments. In the example of FIG. 3, the PIC 305 is a photonics component of the receiver 300 (e.g., PIC 110) that interfaces with a data receiver component 320 (e.g., receiver 115), which is configured to handle electrical processing, filtering, and demodulation of the electrical data. In some example embodiments, the PIC 305 and data receiver 320 can each be components integrated on an opto-ASIC system, as discussed in further details below with reference to FIG. 7.

As illustrated, the PIC 305 receives the optical signal (e.g., from a fiber), which is then input into SOA 310. The optical signal can include optical data sent in a multi-mode format such as PAM4 by one or more transmitters (e.g., data transmitter 105 in loopback mode, external transmitter 177).

As discussed, the received signal strength can vary according to different transmitter strengths and path losses. In some example embodiments, the optical signal is amplified by the SOA 310 and then input into a data photodiode 315 (e.g., a highspeed photodiode) for conversion into electrical current. The data photodiode 315 is a light sensing element that receives the photons of the optical signal and converts them into electrical current exhibiting the modulated data.

After the data photo diode 315 converts the signal into a small electrical current, the electrical current is input into the TIA 325 of the data receiver 320. The TIA 325 then amplifies and converts the current into output voltage, which can then be further processed by FFE 330, analyzed by eye scan module 335, and undergo clock recovery and output by CDR 345, according to some example embodiments.

Figure 3B:
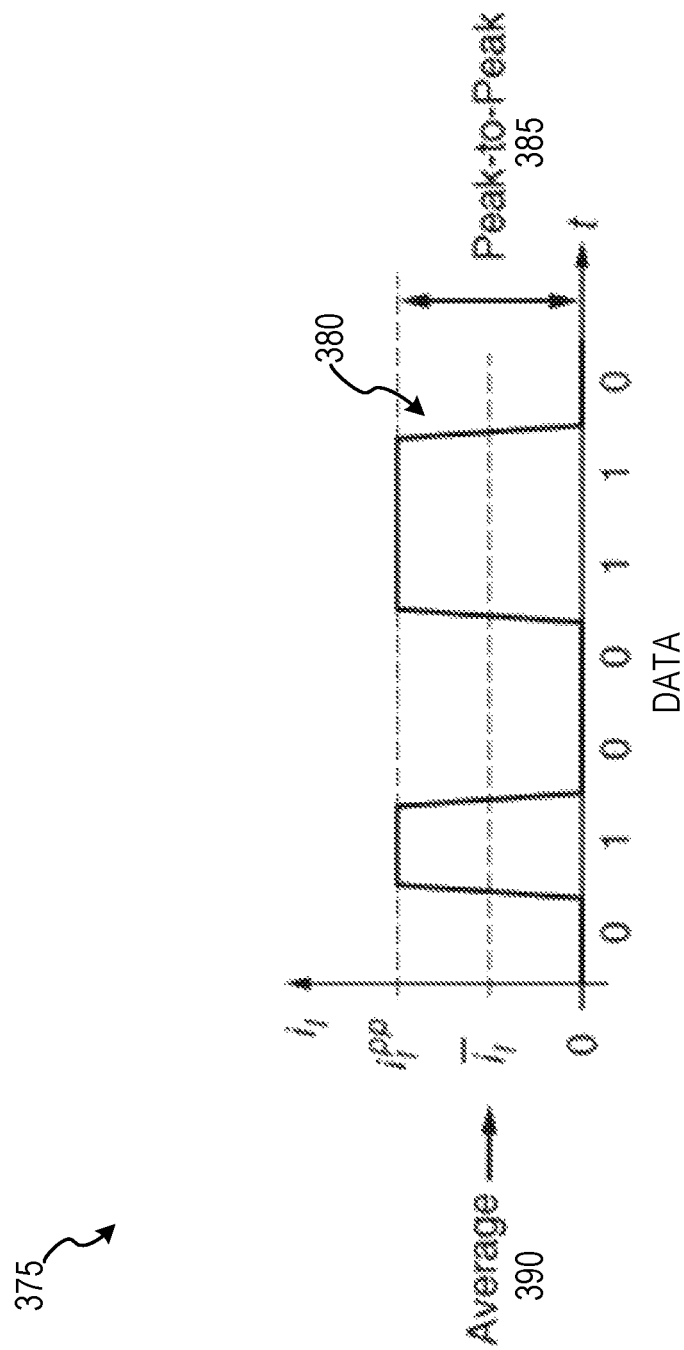
FIG. 3B shows a graph of example current signal, according to some example embodiments.

Further, in some embodiments, a RSSI module 340 (e.g., RSSI circuit) is connected to the input electrical path of the TIA 325. The RSSI module 340 measures the average received signal strength (e.g., DC current) received by the data receiver 320. For example, FIG. 3B shows a graph 375 of example current data signal 380 generated by the photodetector 315 (FIG. 3A) and received by the data receiver 320 (FIG. 3A), where data (ones and zeros) are displayed on the horizontal axis and current is displayed on the vertical axis. As displayed in FIG. 3B, the data signal 380 exhibits a peak to peak value 385, which is converted into a peak to peak voltage signal by the TIA 325 (FIG. 3A). The data signal 380 can further be detected on its average strength value 390, which is the average of the signals peak to peak swing. In some example embodiments, the RSSI 340 (FIG. 3A) receives the signal 380 and generates signal or data in memory indicating the average strength value 390 to indicate the average strength of the signal received by the optical receiver 300 (e.g., a receiver assembly in an optical transceiver). In some example embodiments, the data receiver 320 does not include a RSSI 340; instead, the average input current value is generated from an average current detecting element, such as monitor photodiode 347 (MPD) that is connected to the input of the TIA 325, which then stores the average value in data or inputs the current value into control logic, such as microcontroller 355.

In some example embodiments, the microcontroller 355 is integrated control logic (e.g., ASIC), or instructions stored and executed by a processor, such as the receiver controller 250 or the PIC controller 215. Upon receiving or otherwise identifying the average input current strength (e.g., from RSSI 340 or monitor photodiode 347), the controller 355 then generates a signal to increase or decrease the amount of gain of the SOA 310 in the PIC 305 to pre-amplify the signal in a closed feedback loop to stabilize the input current at the TIA 325. For example, in response to the input current falling at the TIA input (e.g., due to high extinction ratio), the microcontroller 355 increases the bias gain of the silicon optical amplifier 310 to further amplify the optical signal before it is converted by the data photodiode 315, thereby relaxing the noise and linear response requirements of the transimpedance amplifier 325. Additionally, in some cases where the ER minimum at the TIA input is satisfied, the microcontroller 355 decreases the gain of the SOA 310 to a minimum level, thereby avoiding wasting power of fixing the SOA gain as constant.

Figure 4:
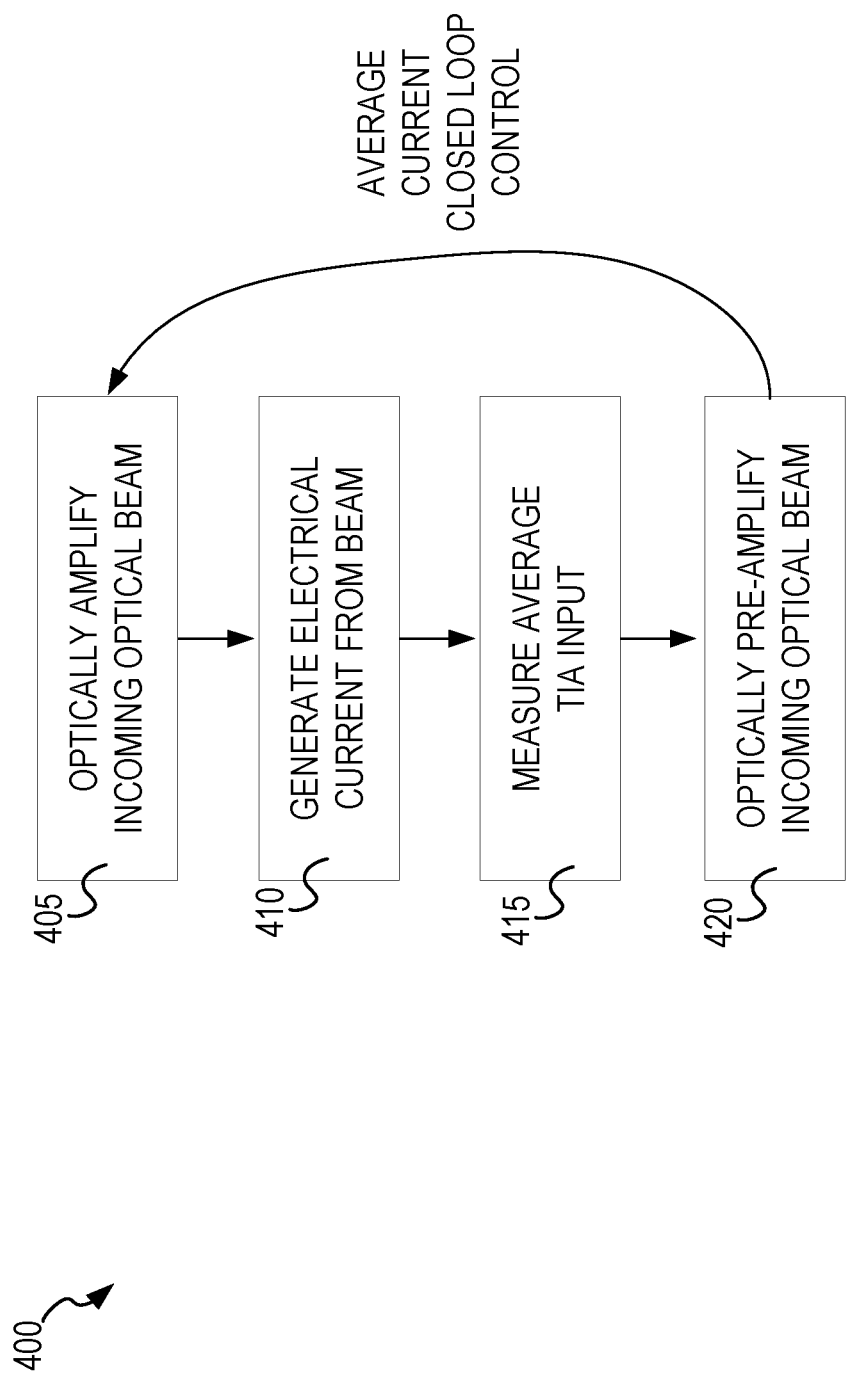
FIG. 4 is a flow diagram of a method for optical preamplification in an optical device using average value feedback based control, according to some example embodiments.

FIG. 4 is a flow diagram of a method 400 for optical preamplification in an optical device using average value feedback based control, according to some example embodiments. In the example of FIG. 4, the received signal strength value (e.g., average current value) of a received signal is used to optically pre-amplify the received light as part of a closed feedback loop to relax operational parameters of the transimpedance amplifier as discussed in FIG. 3 above.

At operation 405, light that is received by the PIC 305 is amplified using an optical amplifier, such as the SOA 310 that is integrated in the PIC 305. The amount of optical gain of the SOA 310 can be adjusted to the gain current provided to the SOA 310. In some example embodiments, the microcontroller 355 uses a current digital to analog (DAC) converter to vary the gain generated by to the SOA 310.

At operation 410, the data photodiode 315 (a type of photodetector) generates electrical current from the amplified light. For example, the optically amplified light is input optically (e.g., via waveguide) into the photodiode 315 to convert the light into electrical signal. For instance, the light may be PAM4 modulated light, which is received by the PIC 310, amplified by the SOA 310, and then converted into PAM4 electrical signal using the data photodiode 315. The PAM4 electrical signal can then be further processed by the data receiver 320 electrical structure, for example, by filtering, demodulating, performing clock recovery, and other operations to the PAM4 electrical signal. In some example embodiments, the receiver 320 comprises a transimpedance amplifier, such as TIA 325, to amplify the voltage of the electrical signal before further processing.

In some example embodiments, at operation 415, the current level of the input of the TIA is measured for use in the optical control loop of the SOA 310. For example, the data receiver 320 can implement a monitor photodiode 347 or RSSI module 340 to average the PAM4 signal to a DC current level.

At operation 420, a hardware processor, such as the microcontroller 355, adjusts the gain of the SOA 310 based on the DC current level changing. For example, as the DC current level drops (e.g., due to increased ER), the microcontroller 355 increases the optical gain to the SOA 310 to compensate for the current level dropping at the TIA input. The microcontroller 355 can be configured to directly access the current level of the TIA input (e.g., via direct electrical contact, via monitor photodiode 347), or can access signal or data values that record the average current at the TIA input (e.g., reading RSSI 340 values).

Figure 5:
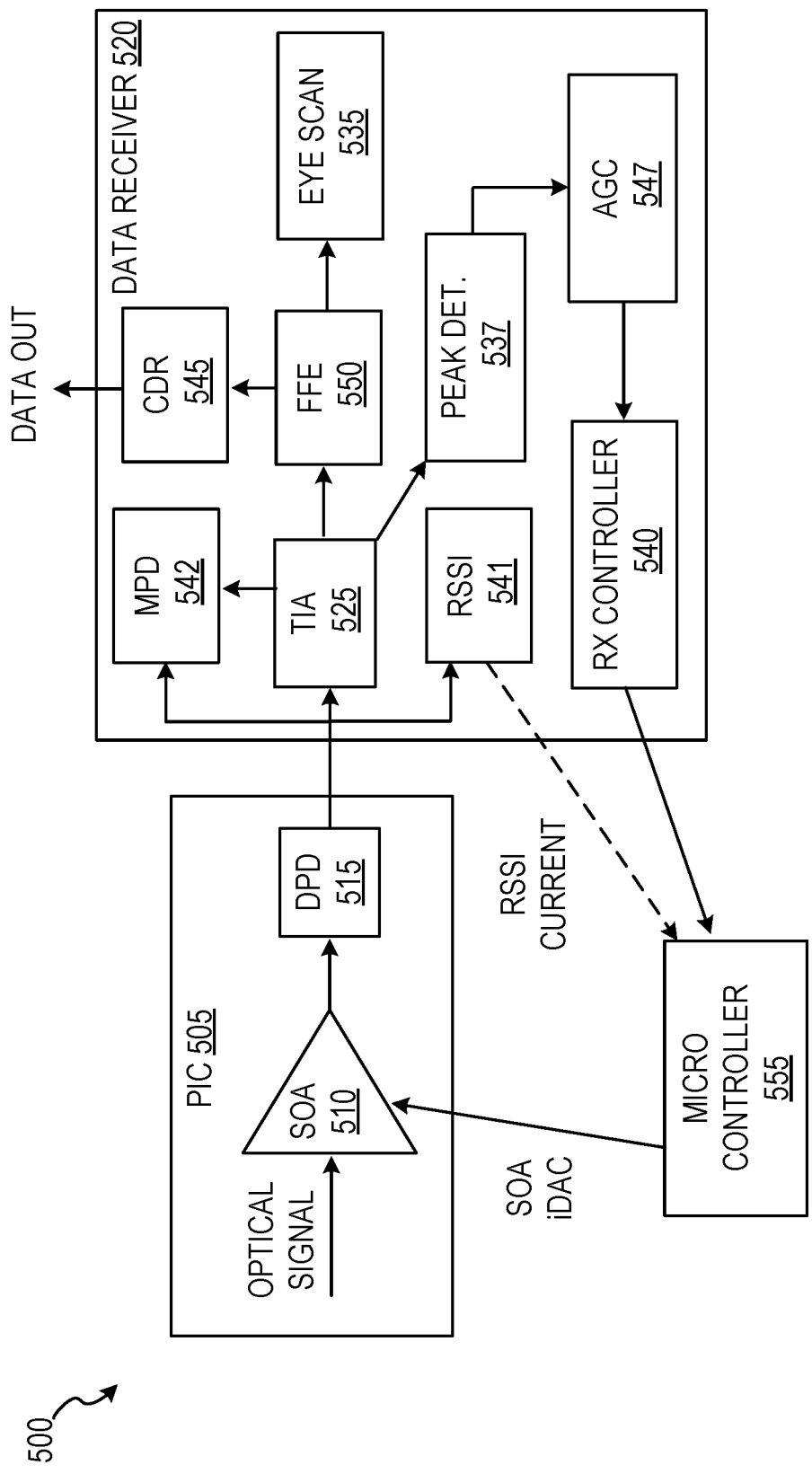
FIG. 5 shows an example compensating receiver architecture using optical modulation amplitude (OMA) based closed loop control of the TIA, according to some example embodiments.

FIG. 5 shows an example compensating receiver architecture 500 using alternating value (e.g., alternating current, swing, peak to peak) based closed loop control of the TIA, according to some example embodiments. As discussed, the received signal strength can vary according to different transmitter strengths and path losses and may be accurate enough to optimize the SOA control to reduce constraints on the TIA (e.g., noise versus linearity). To this end, the architecture 500 can be implemented to provide OMA closed loop control of the TIA. In the example of FIG. 5, the PIC 505 is a photonics component of the receiver architecture 500 (e.g., PIC 110) that interfaces with the data receiver component 520 (e.g., data receiver 115), which is configured to handle electrical processing, filtering, and demodulation of the received electrical data. In some example embodiments, the PIC 505 and data receiver 520 can each be components integrated on an opto-ASIC system, as discussed in further details below with reference to FIG. 7.

As illustrated, the PIC 505 receives the optical signal (e.g., from a single mode fiber), which is then input into SOA 510. The optical signal can include optical data in a multi-mode format such as PAM4 signal that is received from one or more transmitters (e.g., data transmitter 105 in loopback mode, external transmitter 177). In some example embodiments, the optical signal is amplified by the silicon amplifier 510 and then input into a data photodiode 515 for conversion into electrical current. The data photo diode 515 is a light sensing element that receives the photons of the optical signal and converts them into electrical current that exhibits the modulated data.

After the data photo diode 515 converts the signal into electrical current, the electrical current is input into a TIA 525. The TIA 525 then converts the input electrical current signal into voltage, which can then be further processed by FFE 550, analyzed by eye scan module 535, and undergo clock recovery and output by CDR 545, according to some example embodiments.

Further, in some embodiments, a RSSI module 541 (e.g., RSSI circuit) is connected to the input electrical path of the TIA 525. The RSSI module 541 measures the average received signal strength (e.g., DC current) received by the data receiver 520. In some example embodiments, the data receiver 520 does not include a RSSI 541, and instead, the average input current value is generated from an average current detecting element, such as photodiode 542 connected to the input of the TIA 525, which then stores the average value in data or inputs the current value into control logic, such as microcontroller 555.

In the example of FIG. 5, the output of the TIA 525 is automatically adjusted using peak detector 537 and automatic gain control 547. In particular, for example, the peak detector 537 can be a circuit structure that is configured to measure the peaks of the signal (e.g., swing, distances between on/off, a high peak value via a top peak and hold circuit, a low peak value via a bottom peak and hold circuit) of the output voltage from the TIA 525. If the current that is input into the TIA 525 varies, for example by decreasing due to increased optical loss or a different transmitter transmitting a lower strength, then the swing measured by the peak detector 537 will be smaller, which is then stored as a memory value (e.g., by receiver controller 540, receiver controller 250) or input as an electrical control signal into the AGC 547. The AGC 547 can be a different AGC circuit that is configured to generate a gain value to control the TIA 525. In some example embodiments, the AGC 547 is hard wired to the TIA 525 such that the AGC 547 automatically increases or decreases the gain of the TIA 525 to stabilize the swing output. In some example embodiments, the AGC gain value is a data value written to memory (e.g., a register of receiver controller 540), which the receiver controller 540 uses to modify the gain of the TIA 525. As such, the AGC value of the 547 is an inverse indicator of the OAM varying because the AGC value will increase as the OAM decreases and vice versa.

In some example embodiments, the controller 555 (e.g., PIC controller 215) uses the AGC value from the AGC 547 to control the gain of the SOA 510. The microcontroller 555 can be an integrated control logic (circuits), or instructions stored and executed by a processor, such as the receiver controller 250 or the PIC controller 215. While the peak detector 537 can be used as an indicator that the OMA and ER are varying, the peak detector 537 output may not vary significantly as it is stabilized by the AGC loop control (e.g., via AGC 547); therefore, the peak detector 537 values may not vary even as the OMA and ER vary. In contrast, the AGC value will more consistently indicate the OMA and ER are varying, as the AGC value is the amount by which the TIA gain will be increased or decreased to stabilize the output swing. To this end, in some example embodiments, the controller 555 is configured to access the register values to access the latest AGC value that is generated by the AGC 547. For example, the AGC 547 may constantly update AGC gain values in registry or memory of the receiver controller 540 and the microcontroller may use a data interface to access the AGC values in the registers of the controller 540. For example, the controller can use a Queued Serial Peripheral Interface (QSPI) interface reconfigured to treat the registers of the controller 540 as a logically mapped memory storage of the controller 555 to constantly retrieve AGC updated values stored in the registers by the AGC 547.

After receiving the latest AGC data, the microcontroller 555 then changes the gain of the SOA 510 (e.g., via a current digital to analog converter, iDAC) to optically pre-amplify the received signal before conversion via the data photodiode 515. For example, in response to the input current falling at the TIA input (e.g., due to increased ER), the microcontroller 555 increases the bias gain of the SOA 510 to further amplify the optical signal before it is converted by the data photodiode 515, thereby relaxing the noise and linear response requirements of the TIA 525. Additionally, in some cases where the ER minimum at the TIA input is satisfied, the controller 555 decreases the gain of the SOA 510 to a minimum level, thereby avoiding wasting power of fixing the SOA gain as constant.

In some example embodiments, the average current value at the TIA input is initially used to bootstrap the SOA control loop (e.g., method 400, FIG. 4), followed by switching to AGC values for SOA control (e.g., method 600, FIG. 6, discussed below) after the architecture 500 is up and running. In particular, and in accordance with some example embodiments, upon initially receiving optical signal, the AGC 547 has not yet generated an AGC value that can be used to control the SOA 510 for pre-amplification (e.g., via register or memory access of controller 540 by controller 555). However, as soon as the photo diode 515 converts the optical signal into electrical current, an average current monitoring component, such as RSSI 540 or photodiode 515 can instantly read the input current, which can be used to increase or decrease the gain to the SOA 510 to initially pre-amplify the signal to bootstrap the TIA optical compensation loop. Then, after the AGC 547 begins generating AGC values (e.g., via data reads or signal input from peak detector 537), the architecture can switch from an average current or RSSI based control of SOA 510 to AGC value based control, which can more accurately indicate changing swing values due to dynamic OMA and ERs, according to some example embodiments.

Although in the example of FIG. 5, the receiver 520 implements a peak detector, in some example embodiments, the peak detector is omitted and other circuits can provide data to the AGC. For example, in some example embodiments, the peak data output by the TIA can be detected by a comparator with a large hysteresis. For example, once the comparator value remains high (due to its hysteresis), the AGC can read the high value and store it in memory (e.g., registers of 540).

Additionally, in some example embodiments, the AGC is omitted and the peak detector is used without the AGC values to adjust the SOA gain to relax the operational constraints of the TIA. For example, upon the input swing varying (e.g., due to loss) the output swing may vary (e.g., decrease), which can be detected by the peak detector circuit at the output of the TIA (e.g., as a smaller output swing). In response to the peak detector determining that the peak to peak value is decreasing, the gain of the SOA can be increased to compensate for the variance without using the AGC module and AGC gain values.

Figure 6:
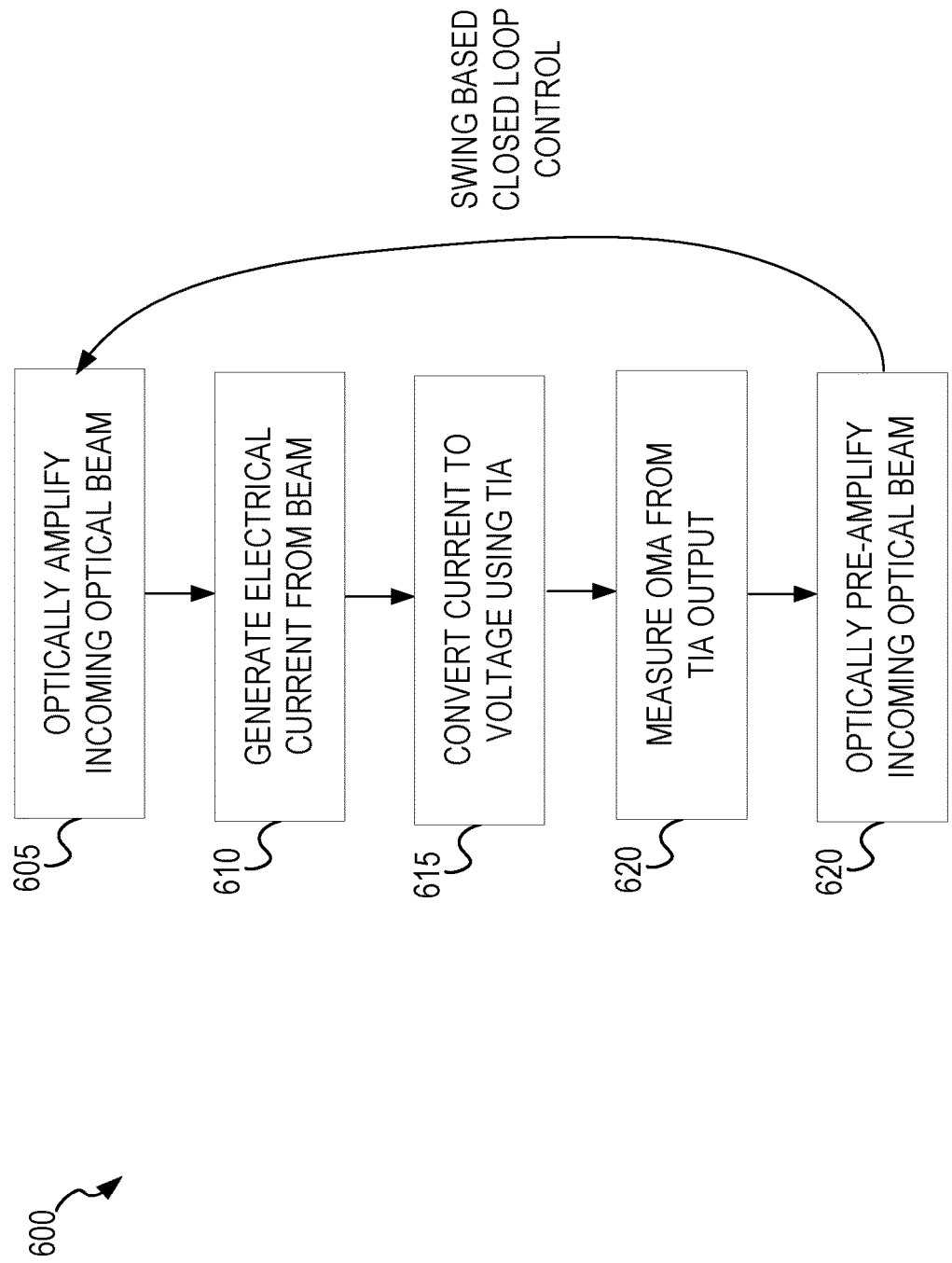
FIG. 6 is a flow diagram of a method for optical preamplification in an optical device using OMA based feedback control, according to some example embodiments.

FIG. 6 is a flow diagram of a method 600 for optical preamplification in an optical device using average value feedback based control, according to some example embodiments. In the example of FIG. 6, gain values that are generated by a TIA gain controller (e.g., AGC 547) are used as dynamic feedback SOA adjustments to optically compensate for variations in received optical signal (e.g., variations in OMA) as discussed in FIG. 5 above.

At operation 605, light that is received by the PIC 505 is amplified using an optical amplifier, such as the SOA 510 that is integrated in the PIC 505. The amount of optical gain of the SOA 510 can be adjusted to the gain current provided to the SOA 510. In some example embodiments, the microcontroller 555 uses a current digital to analog converter (iDAC) to vary the gain generated by to the SOA 510.

At operation 610, the data photodiode 515 (a type of photodetector) generates electrical current from the amplified light. For example, the optically amplified light is input optically (e.g., via waveguide) into the photodiode 515 to convert the light into electrical signal. For instance, the light may be PAM4 modulated light, which is received by the PIC 510, amplified by the SOA 510, and then converted into PAM4 electrical signal using the data photodiode 515. The PAM4 electrical signal can then be further processed by the data receiver 520 electrical structure, for example, by filtering, demodulating, performing clock recovery, and other operations to the PAM4 electrical signal. In some example embodiments, the receiver 520 comprises a transimpedance amplifier, such as TIA 525, to amplify the voltage of the electrical signal before further processing.

At operation 615, the TIA 525 converts the electrical signal with a small current (e.g., PAM4 electrical signal as generated by the data photodiode 515) into an amplified electrical signal that has a large voltage. At operation 620, the swing or alternating value of the signal generated by the TIA 515 is measured. For example, at operation 620, the TIA 515 outputs into a peak detector 537, which generates the difference of the top peak (high power) and the bottom beam (lowest power). The peak to peak value can be used by AGC 547 to dynamically adjust the gain of the TIA 525 to the peak to peak value of the signal stabilized. In some example embodiments, at operation 620, the alternating values are the constantly changing AGC data values written to storage (e.g., register of receiver controller 540).

At operation 620, a hardware processor, such as the microcontroller 555, adjusts the optical gain of the SOA 510 based on the TIA gain adjustment values. For example, the microcontroller 555 uses a data interface to access the register of the receiver controller to receive the AGC and constantly adjust the SOA gain value (e.g., via iDAC) in the same direction as the changing AGC values as part of a closed and dynamic feedback look that can optically compensate for changing OMA of the received light.

In some example embodiments, the optical compensation control loop is initiated (e.g., bootstrapped) using the average DC value, followed by switching to the alternating swing value based control (e.g., based on AGC values) for finer control. For example, upon first receiving the light, the optical receiver can use the monitor photodiode or RSSI value to determine the average value of the signal at the TIA input. At a later time (e.g., milliseconds later), the AGC controller for the TIA begins generating gain adjustments for the TIA, which are stored to memory. Upon the gain adjustments being generated, the optical control loop switches from average based to swing (e.g., based on AGC updates) for more refined control of the optical preapplication and OMA compensation, according to some example embodiments.

Figure 7:
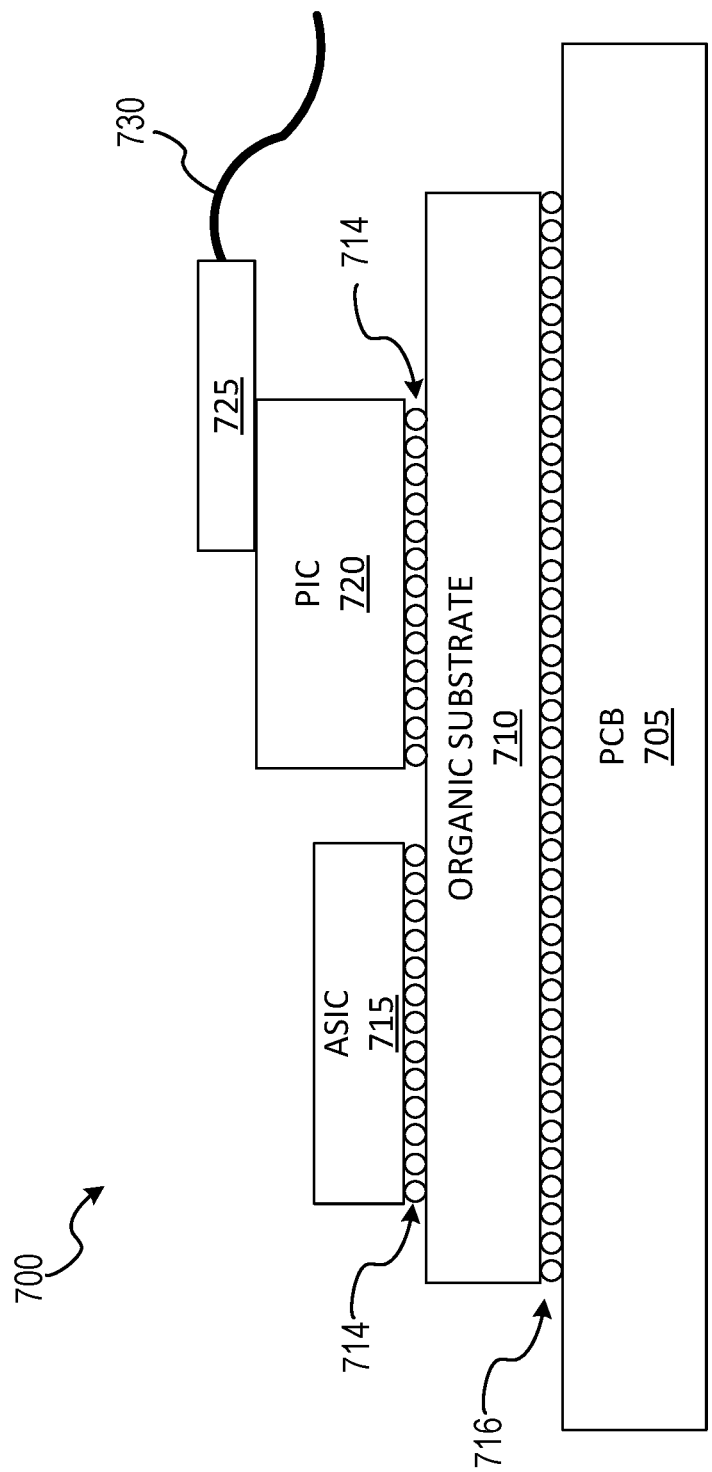
FIG. 7 is an illustration of an opto-electrical device (e.g., optical transceiver) including one or more optical devices, according to an embodiment of the disclosure.

FIG. 7 is an illustration of an opto-electrical device 700 (e.g., optical transceiver) including one or more optical devices, according to an embodiment of the disclosure. In this embodiment, the opto-electrical device 700 is shown to include printed circuit board (PCB) substrate 705, organic substrate 710, ASIC 715, and PIC 720. In this embodiment, the PIC 720 may include one or more optical structures described above (e.g., PIC 110, PIC 305, PIC 505).

In some example embodiments, the PIC 720 includes silicon on insulator (SOI) or silicon based (e.g., silicon nitride (SiN)) devices, or may comprise devices formed from both silicon and a non-silicon material. Said non-silicon material (alternatively referred to as "heterogeneous material") may comprise one of III-V material, magneto-optic material, or crystal substrate material. III-V semiconductors have elements that are found in group III and group V of the periodic table (e.g., Indium Gallium Arsenide Phosphide (InGaAsP), Gallium Indium Arsenide Nitride (GainAsN)). The carrier dispersion effects of III-V based materials may be significantly higher than in silicon based materials, as electron speed in III-V semiconductors is much faster than that in silicon. In addition, III-V materials have a direct bandgap which enables efficient creation of light from electrical pumping. Thus, III-V semiconductor materials enable photonic operations with an increased efficiency over silicon for both generating light and modulating the refractive index of light. Thus, III-V semiconductor materials enable photonic operation with an increased efficiency at generating light from electricity and converting light back into electricity.

The low optical loss and high quality oxides of silicon are thus combined with the electro-optic efficiency of III-V semiconductors in the heterogeneous optical devices described below; in embodiments of the disclosure, said heterogeneous devices utilize low loss heterogeneous optical waveguide transitions between the devices' heterogeneous and silicon-only waveguides.

Magneto-optic (MO) materials allow heterogeneous PICs to operate based on the MO effect. Such devices may utilize the Faraday Effect, in which the magnetic field associated with an electrical signal modulates an optical beam, offering high bandwidth modulation, and rotates the electric field of the optical mode enabling optical isolators. Said MO materials may comprise, for example, materials such as such as iron, cobalt, or yttrium iron garnet (YIG). Further, in some example embodiments, crystal substrate materials provide heterogeneous PICs with a high electro-mechanical coupling, linear electro optic coefficient, low transmission loss, and stable physical and chemical properties. Said crystal substrate materials may comprise, for example, lithium niobate (LiNbO3) or lithium tantalate (LiTaO3).

In the example illustrated, the PIC 720 exchanges light with fiber 730 via prism 725; said prism is a misalignment-tolerant device used to couple an optical mode onto a single mode optical fiber, according to some example embodiments. In other example embodiments, multiple fibers are implemented to receive light from the prism 725 for various optical modulation formats (e.g., PAM4; parallel single mode, with four lanes (PSM4)).

In some example embodiments, the optical devices of PIC 720 are controlled, at least in part, by control circuitry included in ASIC 715. In this embodiment, the ASIC 715 may include one or more optical structures described above (e.g., data transmitter 105, data receiver 115, data receiver 320, a PIC controller external to PIC 110). Both ASIC 715 and PIC 720 are shown to be disposed on copper pillars 714, which are used for communicatively coupling the PICs via organic substrate 710. PCB 705 is coupled to organic substrate 710 via ball grid array (BGA) interconnect 716, and may be used to interconnect the organic substrate (and thus, ASIC 715 and PIC 720) to other components of system 700 not shown (e.g., interconnection modules, power supplies, etc.).

Figure 8:
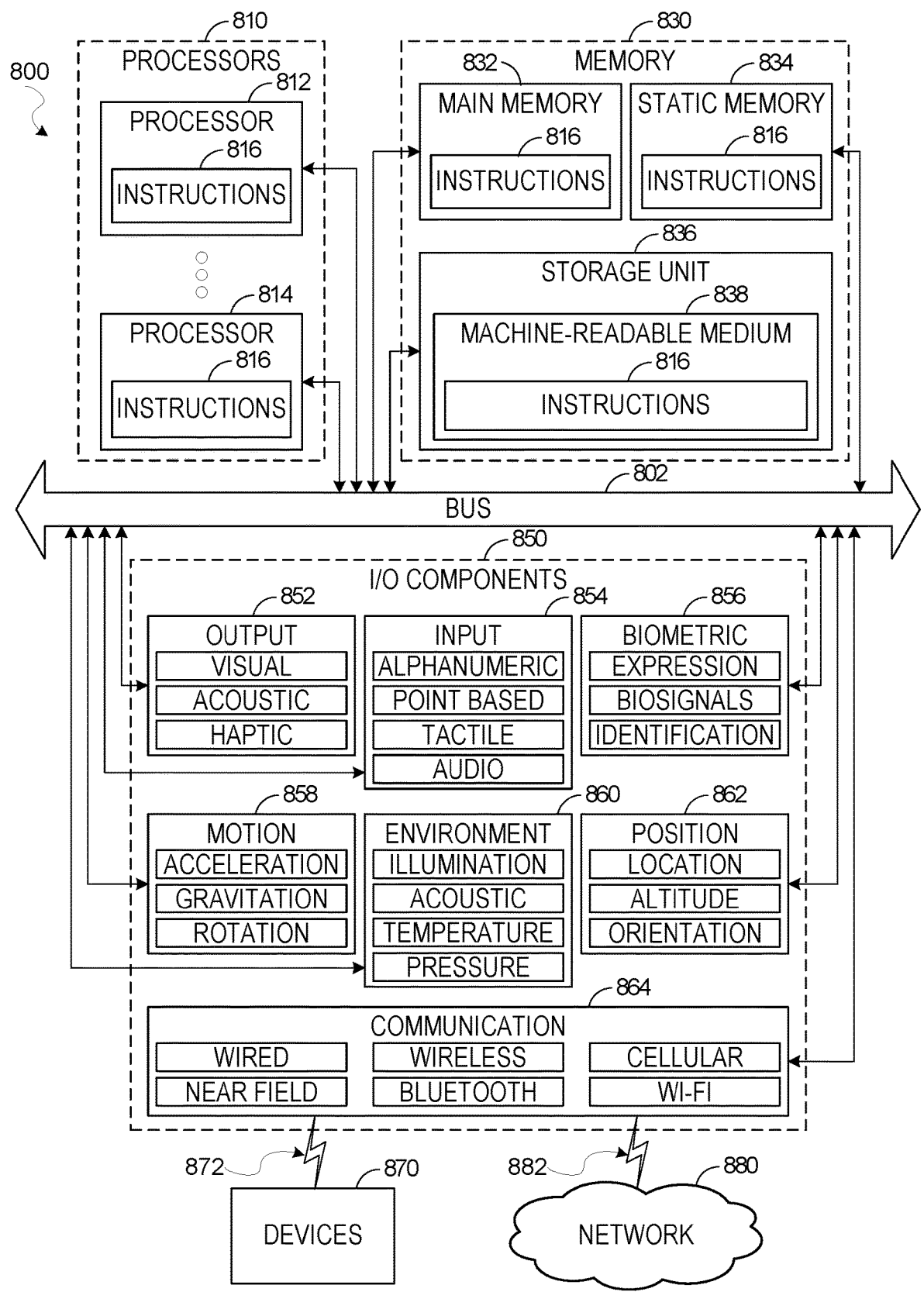
FIG. 8 illustrates example architecture of a machine in the form of a computer system within which a set of instructions may be executed by a processor that causes the machine to implement closed loop preamplification, according to some example embodiments.

FIG. 8 illustrates a diagrammatic representation of a machine 800 in the form of a computer system within which a set of instructions may be executed for causing the machine to perform any one or more of the methodologies discussed herein, according to an example embodiment. Specifically, FIG. 8 shows a diagrammatic representation of the machine 800 in the example form of a computer system, within which instructions 816 (e.g., software, a program, an application, an applet, an app, or other executable code) that are stored on a machine-readable medium 838 (e.g., memory) for causing the machine 800 to perform any one or more of the methodologies discussed herein may be executed. The instructions 816 transform the general, non-programmed machine 800 into a particular machine 800 programmed to carry out the described and illustrated functions in the manner described. In alternative embodiments, the machine 800 operates as a standalone device or may be coupled (e.g., networked) to other machines. In a networked deployment, the machine 800 may operate in the capacity of a server machine or a client machine in a server-client network environment, or as a peer machine in a peer-to-peer (or distributed) network environment. The machine 800 may comprise, but not be limited to, a server computer, a client computer, a personal computer (PC), a tablet computer, a laptop computer, a netbook, a set-top box (STB), a PDA, an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine capable of executing the instructions 816, sequentially or otherwise, that specify actions to be taken by the machine 800. Further, while only a single machine 800 is illustrated, the term "machine" shall also be taken to include a collection of machines 800 that individually or jointly execute the instructions 816 to perform any one or more of the methodologies discussed herein.

The machine 800 may include processors 810, memory 830, and I/O components 850, which may be configured to communicate with each other such as via a bus 802. In an example embodiment, the processors 88 (e.g., a CPU, a Reduced Instruction Set Computing (RISC) processor, a Complex Instruction Set Computing (CISC) processor, a Graphics Processing Unit (GPU), a Digital Signal Processor (DSP), an ASIC, a Radio-Frequency Integrated Circuit (RFIC), another processor, or any suitable combination thereof) may include, for example, a processor 812 and a processor 814 that may execute the instructions 816. The term "processor" is intended to include multi-core processors that may comprise two or more independent processors (sometimes referred to as "cores") that may execute instructions contemporaneously. Although FIG. 8 shows multiple processors 810, the machine 800 may include a single processor with a single core, a single processor with multiple cores (e.g., a multi-core processor), multiple processors with a single core, multiple processors with multiples cores, or any combination thereof.

The memory 830 may include a main memory 832, a static memory 834, and a storage unit 836, all accessible to the processors 810 such as via the bus 802. The main memory 830, the static memory 834, and storage unit 836 store the instructions 816 embodying any one or more of the methodologies or functions described herein. The instructions 816 may also reside, completely or partially, within the main memory 832, within the static memory 834, within the storage unit 836, within at least one of the processors 810 (e.g., within the processor's cache memory), or any suitable combination thereof, during execution thereof by the machine 800.

The I/O components 850 may include a wide variety of components to receive input, provide output, produce output, transmit information, exchange information, capture measurements, and so on. The specific I/O components 850 that are included in a particular machine will depend on the type of machine. For example, portable machines such as mobile phones will likely include a touch input device or other such input mechanisms, while a headless server machine will likely not include such a touch input device. It will be appreciated that the I/O components 850 may include many other components that are not shown in FIG. 8. The I/O components 850 are grouped according to functionality merely for simplifying the following discussion and the grouping is in no way limiting. In various example embodiments, the I/O components 850 may include output components 852 and input components 854. The output components 852 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The input components 854 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

In further example embodiments, the I/O components 850 may include biometric components 856, motion components 858, environmental components 860, or position components 862, among a wide array of other components. For example, the biometric components 856 may include components to detect expressions (e.g., hand expressions, facial expressions, vocal expressions, body gestures, or eye tracking), measure biosignals (e.g., blood pressure, heart rate, body temperature, perspiration, or brain waves), identify a person (e.g., voice identification, retinal identification, facial identification, fingerprint identification, or electroencephalogram-based identification), and the like. The motion components 858 may include acceleration sensor components (e.g., accelerometer), gravitation sensor components, rotation sensor components (e.g., gyroscope), and so forth. The environmental components 860 may include, for example, illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detection concentrations of hazardous gases for safety or to measure pollutants in the atmosphere), or other components that may provide indications, measurements, or signals corresponding to a surrounding physical environment. The position components 862 may include location sensor components (e.g., a GPS receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 850 may include communication components 864 operable to couple the machine 800 to a network 880 or devices 870 via a coupling 882 and a coupling 872, respectively. For example, the communication components 864 may include a network interface component or another suitable device to interface with the network 880. In further examples, the communication components 864 may include wired communication components, wireless communication components, cellular communication components, Near Field Communication (NFC) components, Bluetooth® components (e.g., Bluetooth® Low Energy), Wi-Fi® components, and other communication components to provide communication via other modalities. The devices 870 may be another machine or any of a wide variety of peripheral devices (e.g., a peripheral device coupled via a USB).

Moreover, the communication components 864 may detect identifiers or include components operable to detect identifiers. For example, the communication components 864 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection components (e.g., microphones to identify tagged audio signals). In addition, a variety of information may be derived via the communication components 864, such as location via Internet Protocol (IP) geolocation, location via Wi-Fi® signal triangulation, location via detecting an NFC beacon signal that may indicate a particular location, and so forth.

The various memories (i.e., 830, 832, 834, and/or memory of the processor(s) 810) and/or storage unit 836 may store one or more sets of instructions and data structures (e.g., software) embodying or utilized by any one or more of the methodologies or functions described herein. These instructions (e.g., the instructions 816), when executed by processor(s) 88, cause various operations to implement the disclosed embodiments.

As used herein, the terms "machine-storage medium," "device-storage medium," and "computer-storage medium" mean the same thing and may be used interchangeably in this disclosure. The terms refer to a single or multiple storage devices and/or media (e.g., a centralized or distributed database, and/or associated caches and servers) that store executable instructions and/or data. The terms shall accordingly be taken to include, but not be limited to, solid-state memories, and optical and magnetic media, including memory internal or external to processors. Specific examples of machine-storage media, computer-storage media and/or device-storage media include non-volatile memory, including by way of example semiconductor memory devices, e.g., erasable programmable read-only memory (EPROM), electrically erasable programmable read-only memory (EEPROM), FPGA, and flash memory devices; magnetic disks such as internal hard disks and removable disks; magneto-optical disks; and CD-ROM and DVD-ROM disks. The terms "machine-storage media," "computer-storage media," and "device-storage media" specifically exclude carrier waves, modulated data signals, and other such media, at least some of which are covered under the term "signal medium" discussed below.

In various example embodiments, one or more portions of the network 880 may be an ad hoc network, an intranet, an extranet, a VPN, a LAN, a WLAN, a WAN, a WWAN, the Internet, a portion of the Internet, a portion of the PSTN, a plain old telephone service (POTS) network, a cellular telephone network, a wireless network, a Wi-Fi® network, another type of network, or a combination of two or more such networks. For example, the network 880 or a portion of the network 880 may include a wireless or cellular network, and the coupling 882 may be a Code Division Multiple Access (CDMA) connection, a Global System for Mobile communications (GSM) connection, or another type of cellular or wireless coupling. In this example, the coupling 882 may implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High Speed Packet Access (HSPA), Worldwide Interoperability for Microwave Access (WiMAX), Long Term Evolution (LTE) standard, others defined by various standard-setting organizations, other long range protocols, or other data transfer technology.

The instructions 816 may be transmitted or received over the network 880 using a transmission medium via a network interface device (e.g., a network interface component included in the communication components 864) and utilizing any one of a number of well-known transfer protocols (e.g., hypertext transfer protocol (HTTP)). Similarly, the instructions 816 may be transmitted or received using a transmission medium via the coupling 872 (e.g., a peer-to-peer coupling) to the devices 870. The terms "transmission medium" and "signal medium" mean the same thing and may be used interchangeably in this disclosure. The terms "transmission medium" and "signal medium" shall be taken to include any intangible medium that is capable of storing, encoding, or carrying the instructions 816 for execution by the machine 800, and includes digital or analog communications signals or other intangible media to facilitate communication of such software. Hence, the terms "transmission medium" and "signal medium" shall be taken to include any form of modulated data signal, carrier wave, and so forth. The term "modulated data signal" means a signal that has one or more of its characteristics set or changed in such a matter as to encode information in the signal.

The terms "machine-readable medium," "computer-readable medium," and "device-readable medium" mean the same thing and may be used interchangeably in this disclosure. The terms are defined to include both machine-storage media and transmission media. Thus, the terms include both storage devices/media and carrier waves/modulated data signals.

The following are example embodiments:

Example 1. A method for processing light using an optical receiver, the method comprising: receiving light by a photonic integrated circuit structure of the optical receiver, the photonic integrated circuit structure including an optical amplifier that is coupled to a photodetector; generating amplified light by optically amplifying the light using the optical amplifier in the photonic integrated circuit structure, the amplified light being amplified based on an optical gain of the optical amplifier; generating an electrical signal by detecting the amplified light using the photodetector in the photonic integrated circuit structure; generating amplified electrical signal using a transimpedance amplifier (TIA) in an electrical circuit structure of the optical receiver, the TIA having a gain controller that updates electrical gain of the TIA based on variations in the amplified electrical signal generated by the TIA; and continuously adjusting the optical gain of the optical amplifier based on the electrical gain of the TIA changing due to the variations in the amplified electrical signal generated by the TIA.

Example 2. The method of any of example 1, further comprising: generating, by the gain controller of the TIA, electrical gain values to adjust the electrical gain of TIA.

Example 3. The method of any of examples 1 or 2, wherein the amplified electrical signal exhibits decreased electrical modulation amplitude due to decreased optical modulation amplitude (OMA) of the light received by the photonic integrated circuit structure.

Example 4. The method of any of examples 1-3, wherein the electrical gain values of the TIA are increased to compensate for the decreased electrical modulation amplitude.

Example 5. The method of any of examples 1-4, wherein the optical gain is increased in response to the electrical gain values being increased, the increased optical gain compensating at least in part for the decreased OMA by increasingly amplifying the light before detection by the photodetector.

Example 6. The method of any of examples 1-5, wherein the TIA outputs to a peak detector circuit, and wherein decreased modulation amplitude is detected as a smaller peak value of the amplified electrical signal.

Example 7. The method of any of examples 1-6, wherein the electrical gain values are stored in memory in the electrical circuit structure, wherein the optical receiver further comprises a hardware processor that is external to the electrical circuit structure, the hardware processor having a data interface to the memory storing the electrical gain value.

Example 8. The method of any of examples 1-7, further comprising: accessing, by the hardware processor, the electrical gain values stored in the memory using the data interface.

Example 9. The method of any of examples 1-8, wherein the hardware processor is a microcontroller.

Example 10. The method of any of examples 1-9, wherein the electrical circuit structure comprises a application-specific integrated circuit (ASIC) and the memory storing the electrical gain values is a register of the ASIC.

Example 11. The method of any of examples 1-10, further comprising: generating, by the hardware processor, an analog signal to adjust the optical gain of the optical amplifier based on the electrical gain of the TIA changing.

Example 12. The method of any of examples 1-11, wherein the analog signal is generated using a digital to analog converter (DAC) coupled to the hardware processor and the optical amplifier.

Example 13. The method of any of examples 1-12, wherein the TIA receives the electrical signal as input and generates the amplified electrical signal by amplifying voltage of the electrical signal.

Example 14. The method of any of examples 1-13, wherein the photodetector is a photodiode that converts the light into the electrical signal.

Example 15. The method of any of examples 1-14, wherein the optical amplifier is a semiconductor optical amplifier (SOA).

Example 16. The method of any of examples 1-15, wherein the optical receiver is part of an optical transceiver, the optical transceiver further comprises an optical transmitter that generates additional light.

Example 17. The method of any of examples 1-16, wherein the optical transceiver receives the light from an optical network, the light being generated by a remote optical transmitter connected to the optical network.

Example 18. The method of any of examples 1-17, further comprising: determining an input signal strength of the electrical signal at an input port of the TIA in the electrical circuit structure; and initially adjusting the optical gain of the optical amplifier to compensate for the input signal strength varying.

Example 19. The method of any of examples 1-18, wherein the input signal strength decreases and wherein the optical gain is adjusted by increasing the optical gain to compensate for the decreased input signal strength at the input port of the TIA in the electrical circuit structure.

Example 20. An optical receiver comprising: a photonic integrated circuit comprising an optical amplifier to optically amplify light based on an optical gain of the optical amplifier, the photonic integrated circuit further comprising a photodetector to generate electrical signal from the optically amplified light; an electronic circuit structure to process the electrical signal generated by the photodetector, the electronic circuit structure comprising a transimpedance amplifier (TIA) that generates amplified electrical signal from the electrical signal generated by the photodetector, the TIA having a gain controller that adjusts electrical gain of the TIA based on variations in the amplified electrical signal generated by the TIA; a hardware processor to continually adjust the optical gain of the optical amplifier based on the electrical gain of the TIA changing due to the variations in the amplified electrical signal generated by the TIA.

Example 21. The optical receiver of example 20, wherein the hardware processor is a microcontroller configured to retrieve electrical gain values from memory of the electronic circuit structure using a data interface; wherein the microcontroller further configured to generate analog signal to adjust the optical gain of the optical amplifier using a digital to analog (DAC) in the optical receiver; and wherein the amplified electrical signal exhibits decreased electrical modulation amplitude due to decreased optical modulation amplitude (OMA) of the light received by the photonic integrated circuit structure, wherein the electrical gain values of the TIA are increased to compensate for the decreased electrical modulation amplitude.

Example 20. The optical receiver of example 18 or 19, wherein the optical gain is increased in response to the electrical gain values being increased, the increased optical gain compensating at least in part for the decreased OMA by increasingly amplifying the light before detection by the photodetector.

In the foregoing detailed description, the method and apparatus of the present inventive subject matter have been described with reference to specific exemplary embodiments thereof. It will, however, be evident that various modifications and changes may be made thereto without departing from the broader spirit and scope of the present inventive subject matter. The present specification and figures are accordingly to be regarded as illustrative rather than restrictive.

What is claimed is:

1. A method for processing light using an optical receiver, the method comprising:
   receiving light by a photonic integrated circuit structure of the optical receiver, the photonic integrated circuit structure including an optical amplifier that is coupled to a photodetector;
   generating amplified light by optically amplifying the light using the optical amplifier in the photonic integrated circuit structure, the amplified light being amplified based on an optical gain of the optical amplifier;
   generating an electrical signal by detecting the amplified light using the photodetector in the photonic integrated circuit structure;
   generating amplified electrical signal using a transimpedance amplifier (TIA) in an electrical circuit structure of the optical receiver, the TIA having a gain controller that generates electrical gain values to adjust an electrical gain of the TIA based on variations in the amplified electrical signal generated by the TIA, the electrical gain values stored in a memory of the electrical circuit structure that is accessed through a data interface by a hardware processor of the optical receiver; and
   continually adjusting the optical gain of the optical amplifier based on the electrical gain of the TIA changing due to the variations in the amplified electrical signal generated by the TIA.

2. The method of claim 1, wherein the amplified electrical signal exhibits decreased electrical modulation amplitude due to decreased optical modulation amplitude (OMA) of the light received by the photonic integrated circuit structure.

3. The method of claim 2, wherein the electrical gain values of the TIA are increased to compensate for the decreased electrical modulation amplitude.

4. The method of claim 3, wherein the optical gain is increased in response to the electrical gain values being increased, the increased optical gain compensating at least in part for the decreased OMA by increasingly amplifying the light before detection by the photodetector.

5. The method of claim 2, wherein the TIA outputs to a peak detector circuit, and wherein decreased modulation amplitude is detected as a smaller peak value of the amplified electrical signal.

6. The method of claim 1, wherein continually adjusting the optical gain comprises: periodically retrieving, by the hardware processor using the data interface, updated electrical gain values stored in the memory of the electrical circuit structure.

7. The method of claim 6, wherein the hardware processor is a microcontroller.

8. The method of claim 6, wherein the electrical circuit structure comprises an application-specific integrated circuit (ASIC) and the memory storing the electrical gain values is a register of the ASIC.

9. The method of claim 1, further comprising:
generating, by the hardware processor, an analog signal to adjust the optical gain of the optical amplifier based on the electrical gain of the TIA changing.

10. The method of claim 9, wherein the analog signal is generated using a digital to analog converter (DAC) coupled to the hardware processor and the optical amplifier.

11. The method of claim 1, further comprising:
determining an input signal strength of the electrical signal at an input port of the TIA in the electrical circuit structure; and
initially adjusting the optical gain of the optical amplifier to compensate for the input signal strength varying.

12. The method of claim 11, wherein the input signal strength varies by decreases and wherein the optical gain is adjusted by increasing the optical gain to compensate for the decreased input signal strength at the input port of the TIA in the electrical circuit structure.

13. The method of claim 1, wherein the optical amplifier is a semiconductor optical amplifier (SOA) and the photodetector is a photodiode.

14. The method of claim 1, wherein the optical receiver is part of an optical transceiver, the optical transceiver further comprises an optical transmitter that generates additional light.

15. The method of claim 14, wherein the optical transceiver receives the light from an optical network, the light being generated by a remote optical transmitter connected to the optical network.

16. An optical receiver comprising:
a photonic integrated circuit comprising an optical amplifier to optically amplify light based on an optical gain of the optical amplifier, the photonic integrated circuit further comprising a photodetector to generate electrical signal from the optically amplified light;
an electronic circuit structure to process the electrical signal generated by the photodetector, the electronic circuit structure comprising a transimpedance amplifier (TIA) that generates amplified electrical signal from the electrical signal generated by the photodetector, the TIA having a gain controller that generates electrical gain values to adjust electrical gain of the TIA based on variations in the amplified electrical signal generated by the TIA, the electrical gain values stored in a memory of the electrical circuit structure; and
a hardware processor to continually adjust the optical gain of the optical amplifier based on the electrical gain of the TIA changing due to the variations in the amplified electrical signal generated by the TIA.

17. The optical receiver of claim 16, wherein the hardware processor is a microcontroller configured to retrieve electrical gain values from the memory of the electronic circuit structure using a data interface;
wherein the microcontroller is further configured to generate an analog signal to adjust the optical gain of the optical amplifier using a digital to analog converter (DAC) in the optical receiver; and
wherein the amplified electrical signal exhibits decreased electrical modulation amplitude due to decreased optical modulation amplitude (OMA) of the light received by the photonic integrated circuit, wherein the electrical gain values of the TIA are increased to compensate for the decreased electrical modulation amplitude.

18. The optical receiver of claim 17, wherein the optical gain is increased in response to the electrical gain values being increased, the increased optical gain compensating at least in part for the decreased OMA by increasingly amplifying the light before detection by the photodetector.

19. The optical receiver of claim 16, wherein the TIA outputs to a peak detector circuit, and wherein changes in modulation amplitude is detected as a changed peak value of the amplified electrical signal.

20. The optical receiver of claim 16, wherein the optical amplifier is a semiconductor optical amplifier and the photodetector is a photodiode.

* * * * *